(12) United States Patent
Kim et al.

(10) Patent No.: US 8,114,203 B2
(45) Date of Patent: Feb. 14, 2012

(54) UNITS FOR COLLECTING PARTICLES, APPARATUS INCLUDING THE SAME AND METHODS FOR COLLECTING PARTICLES USING THE SAME

(75) Inventors: Ki-Su Kim, Yongin-si (KR); Jung-Hyeon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 1059 days.

(21) Appl. No.: 12/009,817

(22) Filed: Jan. 22, 2008

(65) Prior Publication Data

US 2008/0176492 A1 Jul. 24, 2008

(30) Foreign Application Priority Data

Jan. 22, 2007 (KR) .......................... 10-2007-0006643

(51) Int. Cl.
*B01D 51/08* (2006.01)

(52) U.S. Cl. ............. 96/389; 55/385.1; 55/395; 55/396; 55/428; 55/429; 55/466; 95/29

(58) Field of Classification Search ................. 55/385.1, 55/392, 394, 395, 396, 428, 429, 430, 466; 62/55.5; 95/29, 288; 96/389; 438/905; 451/65
See application file for complete search history.

(56) References Cited

U.S. PATENT DOCUMENTS

| | | | |
|---|---|---|---|
| 4,319,891 A * | 3/1982 | Anderson et al. ................. 95/29 |
| 4,378,976 A * | 4/1983 | Rush .................................. 95/29 |
| 6,090,208 A * | 7/2000 | Han .................................. 118/715 |
| 6,106,626 A * | 8/2000 | Guan et al. ..................... 118/715 |
| 6,107,198 A * | 8/2000 | Lin et al. ......................... 438/680 |
| 6,165,272 A * | 12/2000 | Liu .................................. 118/715 |
| 6,350,303 B2 * | 2/2002 | Wu .................................. 96/417 |
| 6,936,086 B2 * | 8/2005 | Harkonen et al. ............... 55/434 |
| 7,141,095 B2 * | 11/2006 | Aitchison et al. ............... 95/273 |
| 7,156,923 B2 * | 1/2007 | Kato et al. ..................... 118/715 |
| 2001/0039883 A1 * | 11/2001 | Wu .................................. 96/417 |
| 2007/0107595 A1 * | 5/2007 | Na .................................. 95/288 |

FOREIGN PATENT DOCUMENTS

| | | |
|---|---|---|
| JP | 5263248 | 12/1993 |
| KR | 20020072373 | 9/2002 |
| KR | 20030081592 | 10/2003 |
| KR | 10-2006-0124021 | 12/2006 |
| KR | 10-2007-0008301 | 1/2007 |

* cited by examiner

*Primary Examiner* — Duane Smith
*Assistant Examiner* — Sonji Turner
(74) *Attorney, Agent, or Firm* — Onello & Mello, LLP

(57) ABSTRACT

A collection unit includes an exhaust conduit providing a path through which a process gas flows, a trap installed in the exhaust conduit, and a collection line connected to the trap. The trap has an inlet through which particles in the process are introduced into the trap, and the collection line penetrates a portion of the exhaust conduit to extend toward an outside region of the exhaust conduit. An apparatus including the collection unit and a method for collecting particles using the same are also provided.

12 Claims, 8 Drawing Sheets

UNITS FOR COLLECTING PARTICLES, APPARATUS INCLUDING THE SAME AND METHODS FOR COLLECTING PARTICLES USING THE SAME

CROSS-REFERENCE TO RELATED APPLICATION

This U.S. non-provisional patent application claims priority under 35 U.S.C §119 of Korean Patent Application 10-2007-0006643, filed in the Korean Intellectual Property Office on Jan. 22, 2007, the entirety of which is hereby incorporated by reference.

BACKGROUND

The present invention relates to units for collecting particles, apparatus including the same and methods for collecting particles using the same.

In general, semiconductor devices may be fabricated using a fabrication process for forming semiconductor chips including electrical circuits on a semiconductor wafer, an electrical die sorting (EDS) process for classifying the semiconductor chips as either good chips or failed chips, and a package process for separating the semiconductor chips from each other and for encapsulating the good chips with epoxy resin.

The fabrication process may comprise a thin film deposition process for forming a material layer on the semiconductor wafer, a chemical mechanical polishing (CMP) process for planarizing the material layer, a lithography process for forming a photoresist pattern on the material layer, an etching process for forming material patterns using the photoresist pattern as an etching mask, an ion implantation process for injecting impurities into predetermined regions of the semiconductor wafer or the material layer, a cleaning process for removing particles on the semiconductor wafer, and a dry process for removing chemical solutions or de-ionized water on the semiconductor wafer.

The fabrication process may be performed using various chemical gases and/or various chemical solutions, and the chemical gases and/or the chemical solutions used in the fabrication process may be vented through some exhaust conduits which are installed in process apparatus. The chemical gases and/or the chemical solutions may coercively flow inside the exhaust conduits by exhaust fans and may be vented out of a clean room in which the process apparatus are located. The chemical gases and/or the chemical solutions may be processed in a final treatment system before venting out of the clean room.

A pressure inside the respective exhaust conduits should be maintained at a constant and stable value in order to smoothly discharge the chemical gases and/or the chemical solutions. When some obstacles exist in the exhaust conduits, the obstacles may disturb flow of the fluid such as the chemical gases and/or the chemical solutions in the exhaust conduits. For example, the chemical gases and/or the chemical solutions vented out from the process apparatus may react on atmosphere or other chemicals in the exhaust conduits to generate byproducts, and the byproducts may be deposited on inner walls of the exhaust conduits, which can cause variation of the pressure in the exhaust conduits and corrosion of the exhaust conduits.

In particular, when the fluid flowing through the exhaust conduits is a flammable material, the flammable material may spontaneously burn to generate particles, and the particles may be deposited onto the inner walls of the exhaust conduits to cause undesired problems.

SUMMARY OF THE INVENTION

Exemplary embodiments of the present invention are directed to units for collecting particles, apparatus including the same and methods for collecting particles using the same.

According to a first aspect, the invention is directed to a collection unit for collecting particles. The collection unit comprises an exhaust conduit providing a path through which a process gas flows and a trap installed in the exhaust conduit. The trap has an inlet through which particles in the process gas are introduced into the trap. A collection line is connected to the trap. The collection line penetrates a portion of the exhaust conduit to extend toward an outside region of the exhaust conduit.

In some embodiments, a diameter of the inlet may be less than an inside diameter of the exhaust conduit, and the inlet may be disposed at a central region of a space in the exhaust conduit.

In some embodiments, the unit may further comprise a plurality of acoustic wave generators installed onto an outer wall of the exhaust conduit. The acoustic wave generators produce acoustic waves which travel toward an inside region of the exhaust conduit. The acoustic wave generators may be disposed to have the same distance therebetween on a cross sectional view of the exhaust conduit. The exhaust conduit may have a circular-shaped cross section. In this case, the acoustic wave generators may be disposed so that an angle between two straight lines connecting the central point of the circular cross section to the adjacent two acoustic wave generators is 90°. Alternatively, the exhaust conduit may have a rectangular-shaped cross section. In this case, the acoustic wave generators may be disposed on a top plate, a bottom plate, a left sidewall and a right sidewall of the exhaust conduit, respectively.

In some embodiments, the unit may further comprise a storage chamber connected to the collection line to store the particles and a vent line connected to a top plate of the storage chamber to exhaust the process gas introduced into the storage chamber. The storage chamber may be disposed under the exhaust conduit. The vent line may be connected to the exhaust conduit. In addition, a blocking plate may be disposed to move toward an inside region or an outside region of the storage chamber, and a driver may be disposed connected to the blocking plate to move the blocking plate. When the blocking plate is completely moved into the storage chamber, a space in the storage chamber may be divided into an upper space and a lower space. The storage chamber may have an opening which penetrates a lower portion of a sidewall thereof to access to the lower space. The opening may be closed or opened by a door.

According to another aspect, the invention is directed to an apparatus having the collection unit. The apparatus comprises a process chamber in which a process is performed, an exhaust conduit connected to the process chamber to exhaust a process gas in the process chamber, and the collection unit installed at the exhaust conduit to collect particles in the process gas which flows through the exhaust conduit.

According to another aspect, the invention is directed to a method for collecting particles in a process gas which flows through an exhaust conduit. According to the method, a trap having an inlet is installed in the exhaust conduit and collects the particles in the process gas into the trap through the inlet.

In some embodiments, the inlet may have a diameter which is less than an inside diameter of the exhaust conduit, and the inlet may be disposed at a central region of a space in the exhaust conduit. The particles may be collected by generating acoustic waves which travel toward an inside region of the exhaust conduit. The acoustic waves may be produced using a plurality of acoustic wave generators disposed onto an outer wall of the exhaust conduit. The particles in the process gas may be gathered at the central region of the space before the inlet during generation of the acoustic waves, and the gathered particles may be flowed into the trap through the inlet.

In some embodiments, the method may further comprise storing the collected particles in the trap into a storage chamber which is disposed under the exhaust conduit. The collected particles in the trap may be introduced into the storage chamber through a collection line which connects the storage chamber to the trap, and the process gas flowed into the storage chamber with the particles may be vented out of the storage chamber through a vent line which connects the storage chamber to the exhaust conduit. In addition, the method may further comprise inserting a blocking plate into the storage chamber to spatially separate an upper space and a lower space in the storage chamber, and removing the particles stored in the lower space.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
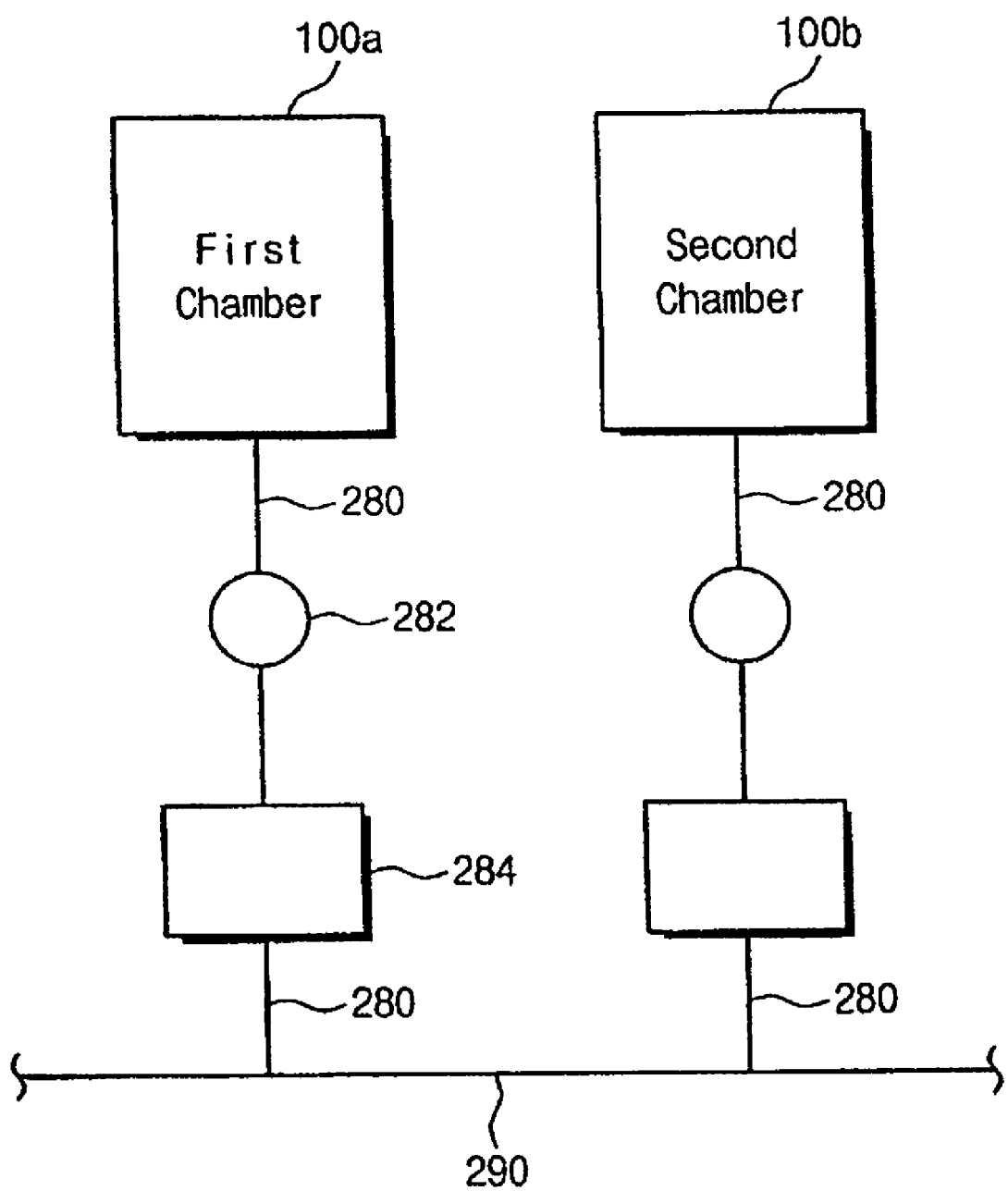
FIG. 1 is a schematic block diagram illustrating an apparatus according to an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes of elements are exaggerated for clarity.

FIG. 1 is a schematic block diagram illustrating a substrate treatment apparatus according to an embodiment of the present invention.

Referring to FIG. 1, the substrate treatment apparatus 1 may comprise first and second chambers 100a and 100b, first and second sub-exhaust conduits 280 connected to the first and second chambers 100a and 100b respectively, and a main exhaust conduit 290 connected to the first and second sub-exhaust conduits 280. In the present embodiment, it is assumed that the substrate treatment apparatus 1 comprises two chambers, for example, the first and second chambers 100a and 100b as illustrated in FIG. 1. However, the substrate treatment apparatus 1 according to the present invention may comprise three or more chambers.

The first and second chambers 100a and 100b provide first and second spaces therein respectively, and predetermined processes may be performed in the first and second spaces. A first process performed in the first space may be the same process as a second process performed in the second space. Alternatively, the first process may be a different process from the second process. The first process may be followed by the second process or vice versa. Further, the first sub-exhaust conduit 280 may have the same configuration and structure as the second sub-exhaust conduit 280. Thus, only the description to the first chamber 100a will be developed hereinafter without repetitive and redundant description of the second chamber 100b.

The first chamber 100a is connected to one end of the first sub-exhaust conduit 280, as described above. A process gas including a reacted gas, an unreacted gas and byproduct in the first chamber 100a may be vented out of the first chamber 100a through the first sub-exhaust conduit 280. The process gas in the first chamber 100a may be vented out while a predetermined process is performed in the first chamber 100a. The process gas in the first chamber 100a may be vented out even before or after the predetermined process.

A pump 282 and a scrubber 284 may be installed in the first sub-exhaust conduit 280. The main exhaust conduit 290 is connected to the other end of the first sub-exhaust conduit 280. Thus, the process gas in the first chamber 100a may be introduced into the main exhaust conduit 290 through the first sub-exhaust conduit 280. The process gas in the main exhaust conduit 290 may be treated in a final treatment system installed at a predetermined place, for example, at a roof of a clean room in which the substrate treatment apparatus 1 is located. The treated process gas may be then vented out of the clean room. The final treatment system may treat the process gas to exhaust a pure gas which meets an environmental specification.

Figure 2:
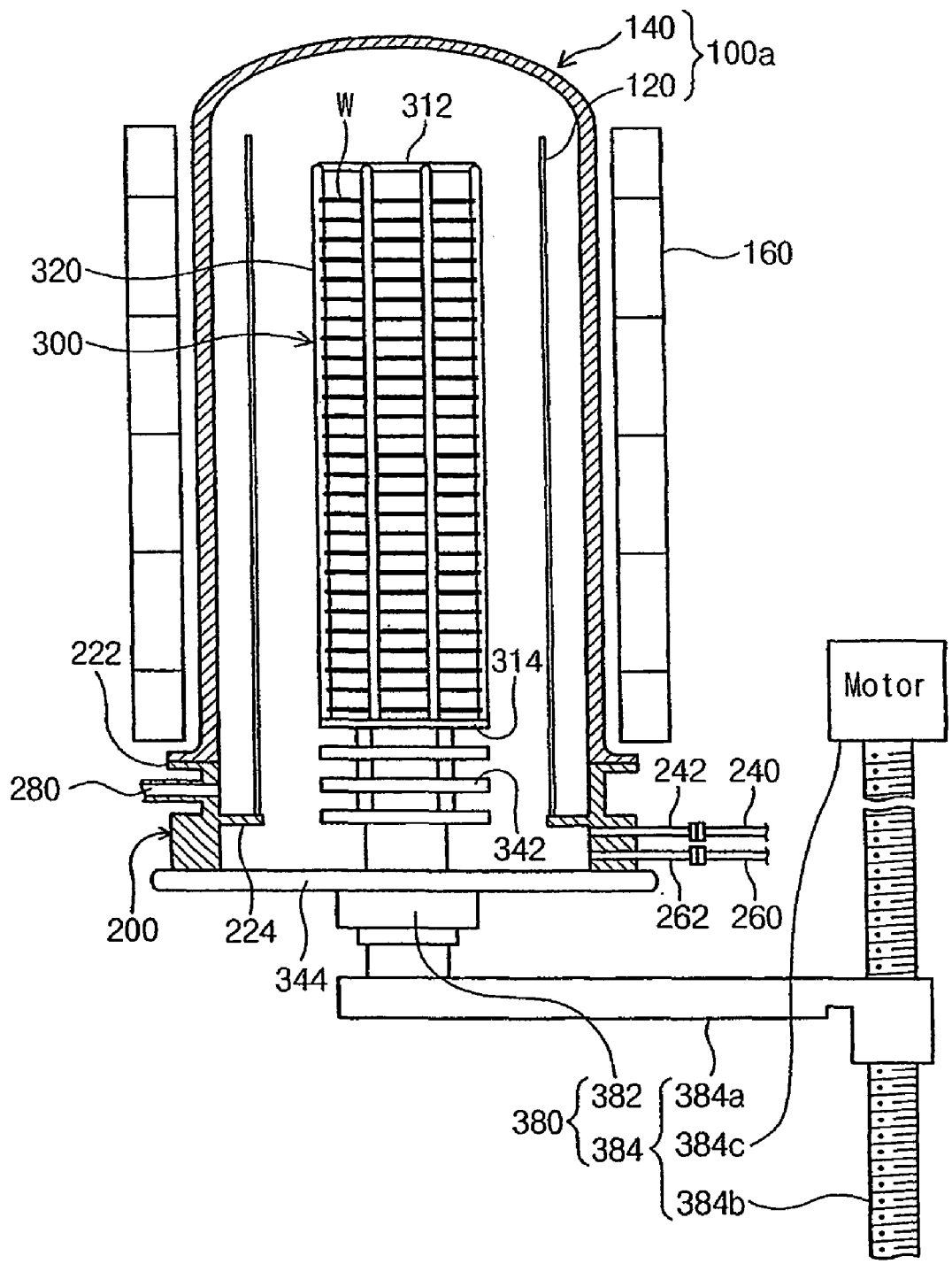
FIG. 2 is a schematic view illustrating a first chamber shown in FIG.

FIG. 2 is a schematic view illustrating an embodiment of a first chamber shown in FIG. 1 and some accessories attached thereto. Hereinafter, even though the first chamber is described in conjunction with a deposition chamber, the first chamber may not be limited to a deposition chamber. For example, the first chamber may correspond to an etching chamber or a cleaning chamber.

The first chamber 100a may provide a space in which a predetermined process is performed. The predetermined process may be applied to wafers W which are loaded into the first chamber 100a. The first chamber 100a may comprise an inner tube 120 and an outer tube 140 surrounding the inner tube 120. The inner and outer tubes 120 and 140 may be quartz tubes. The inner tube 120 may be a cylindrical tube having a top opening and a bottom opening. The outer tube 140 may also have a cylindrical shape. However, the outer tube 140 may have only a bottom opening without a top opening. That is, a top portion of the outer tube 140 may be closed. In addition, a flange 200 having a cylindrical shape may be attached to a lower portion of the outer tube 140. The flange 200 may also have a top opening and a bottom opening.

A heater 160 may be disposed outside the outer tube 140. For example, the heater 160 may be installed to surround a sidewall of the outer tube 140. The heater 160 may heat up the first chamber 100a so that the atmosphere in the first chamber 100a maintains a process temperature during the predetermined process.

The wafers W are loaded into a boat 300 before the predetermined process. The boat 300 may have an upper plate 312, a lower plate 314 facing the upper plate 312, and a plurality of vertical supporters 320 installed between the upper and lower plates 312 and 314. When the first chamber 100a is a vertical chamber, the upper and lower plates 312 and 314 are parallel to a horizontal line. Each of the vertical supporters 320 has a plurality of slots in which the wafers W are inserted. The number of the slots of the respective supporters 320 may be about 50 to 100. A plurality of heat radiating plates 342 may be provided under the lower plate 314. The heat radiating plates 342 may be made of quartz and installed to be parallel to the lower plate 314.

The boat 300 may be supported by a cap 344. That is, the boat 300 is mounted on the cap 344. The cap 344 may have a shape of a horizontal plate. Thus, when the boat 300 is loaded into the inner tube 120, the cap 344 may be in contact with a lower portion of the flange 200 to seal up the space in the first chamber 100a. A driving unit 380 may be attached to the cap 344. The driving unit 380 may comprise a motor 382 for rotating the cap 344 and an elevator 384 for moving up/down the cap 344. The elevator 384 may have a vertical screw 384b rotated by a motor 384c and a bracket 384a in which the screw 384b is inserted. The motor 382 may be disposed between the cap 344 and the bracket 384a. Thus, when the motor 384c is fixed to a predetermined position and the motor 384c is operated to rotate the screw 384b, the bracket 384a may move up or down. As a result, the cap 344 and the boat 300 may move up or down if the motor 384c operates.

A standby room (not shown) is provided under the flange 200. The wafers W may be loaded into the boat 300 which is positioned in the standby room prior to the predetermined process, and the boat 300 having the wafers W may move up into the inner tube 120. The flange 200 may comprise a body having a cylindrical shape, an outer ring 222 protruding from an upper portion of the body toward an outside of the body, and an inner ring 224 protruding from an inner wall of the body toward an inside of the body. The outer ring 222 is attached to a lower end of the outer tube 140 to support the outer tube 140. Similarly, the inner ring 224 is attached to a lower end of the inner tube 120 to support the inner tube 120.

A process gas supply conduit 240 is installed outside of the flange 200, and the process gas supply conduit 240 may be connected to a process gas port 242. The process gas port 242 may extend to penetrate the body of the flange 200. Thus, a process gas may be injected into the inner tube 120 through the process gas supply conduit 240 and the process gas port 242. Further, a purge gas supply conduit 260 is installed outside of the flange 200, and the purge gas supply conduit 260 may be connected to a purge gas port 262. The purge gas port 262 may extend to penetrate the body of the flange 200. Thus, a purge gas may be injected into the inner tube 120 through the purge gas supply conduit 260 and the purge gas port 262. In addition, a first sub-exhaust conduit 280 is installed outside of the flange 200, and the first sub-exhaust conduit 280 may extend to penetrate the body of the flange 200. The first sub-exhaust conduit 280 may penetrate the body between the outer ring 222 and the inner ring 224.

According to the first chamber 100a and the accessories described above, the process gas may be introduced into a space surrounded by the body of the flange 200. The process gas introduced into the flange 200 may flow upwardly and react in the inner tube 120 to form a thin film on the wafers W. While the process gas reacts in the inner tube 120, one or more byproducts may be generated. The process gas and the byproducts in the inner tube 120 may flow downwardly through a space between the inner tube 120 and the outer tube 140 and may be vented out through the first sub-exhaust conduit 280.

Figure 3:
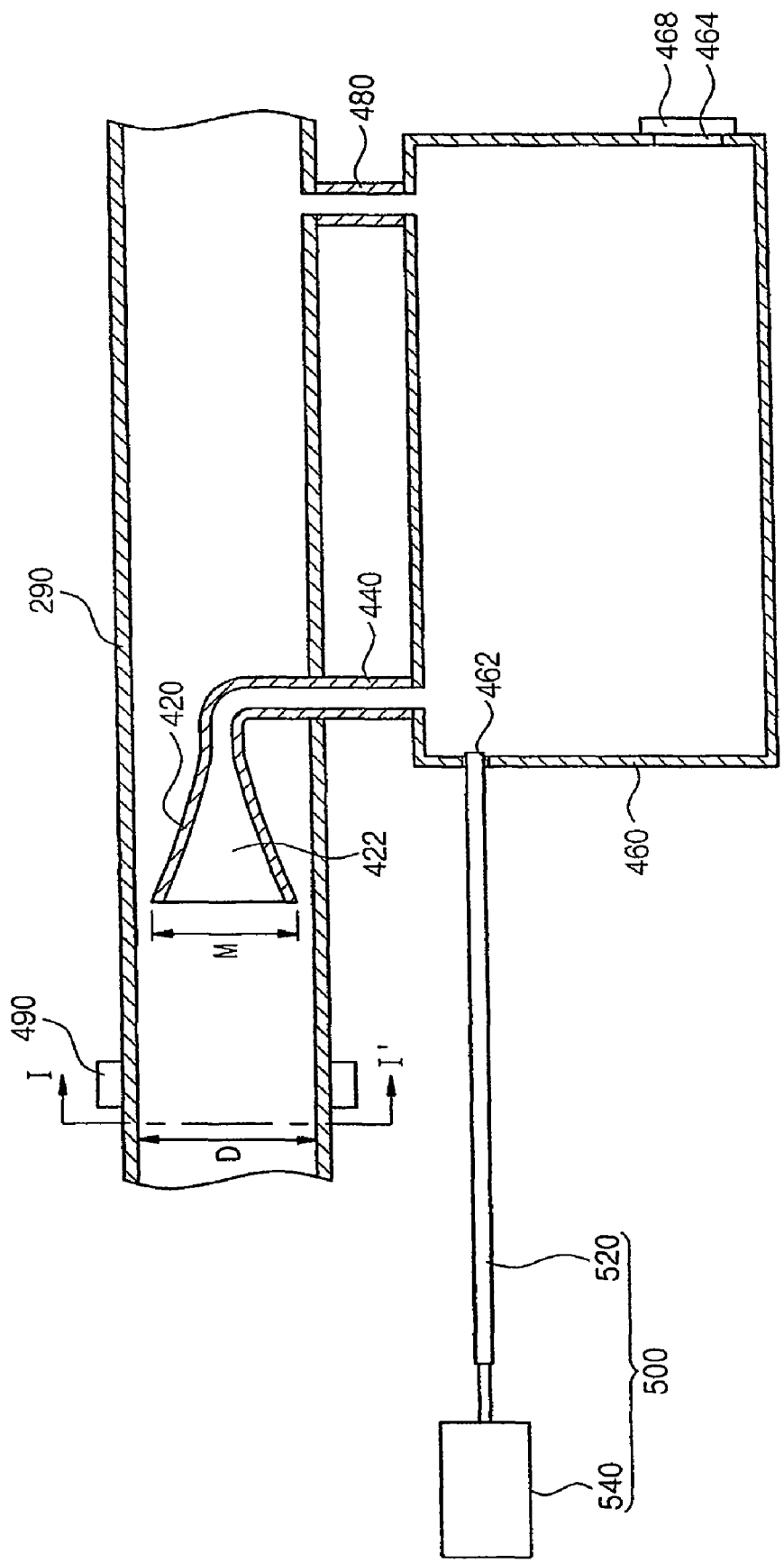
FIG. 3 is a schematic view illustrating a collection unit according to an embodiment of the present invention.
Figure 4:
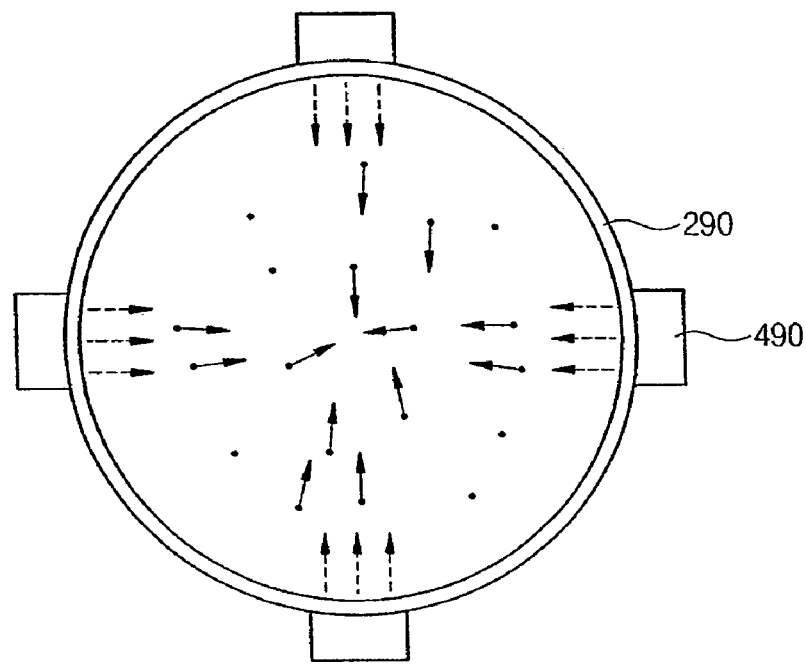
FIGS. 4 to 6 are cross-sectional views taken along line I-I' of FIG. 3.
Figure 5:
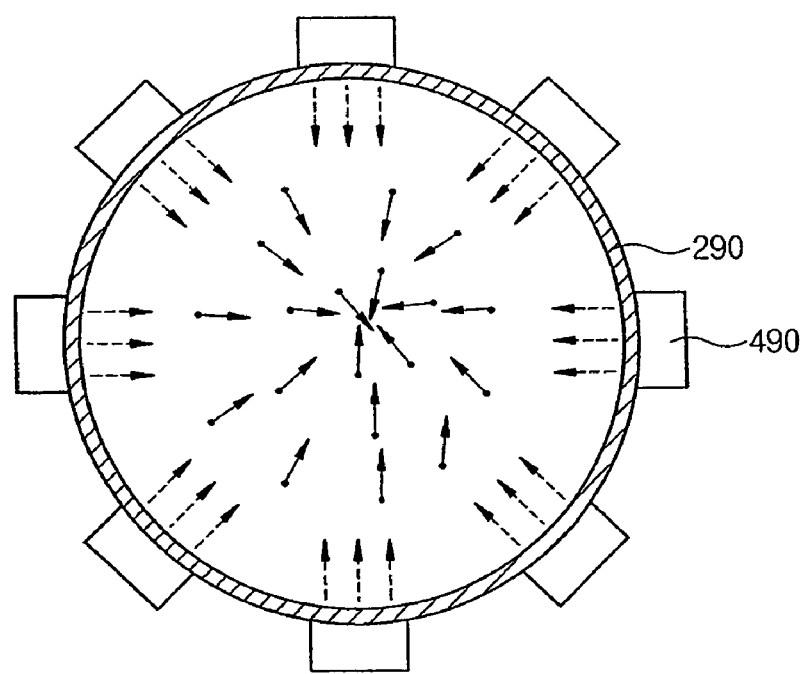
Figure 6:
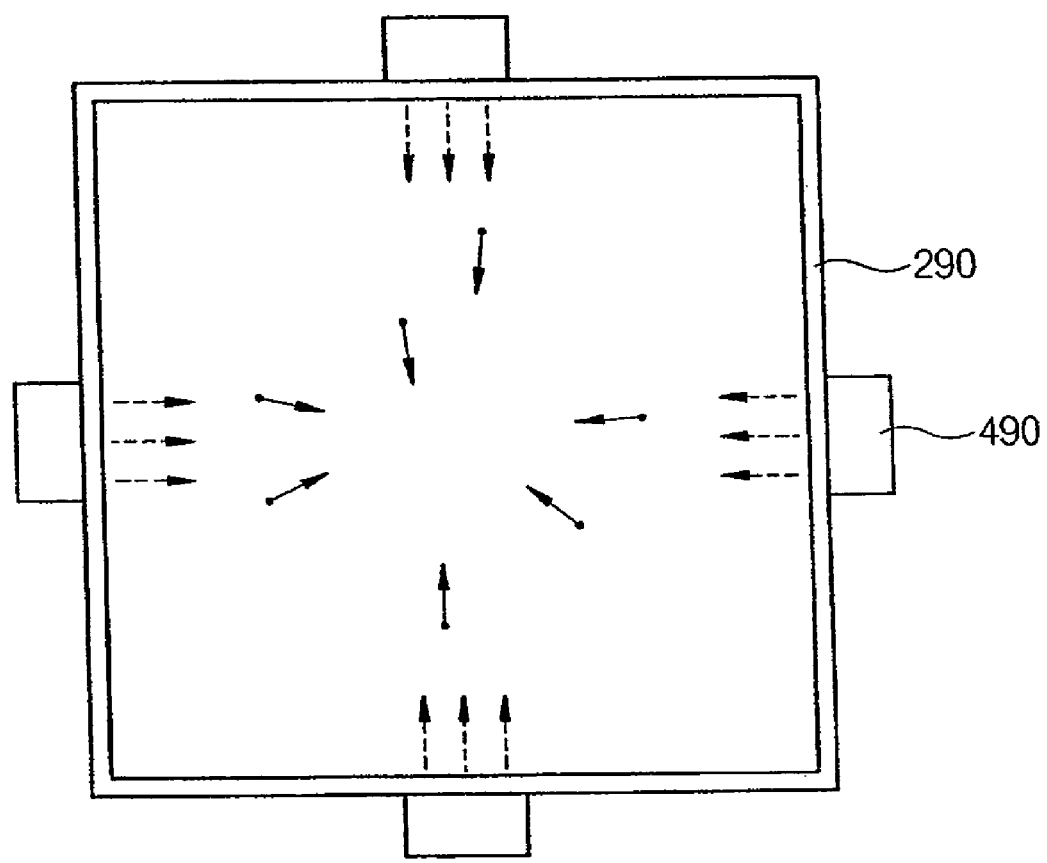

FIG. 3 is a schematic view illustrating a collection unit according to an embodiment of the present invention, and FIGS. 4 to 6 are cross-sectional views taken along the line I-I' of FIG. 3.

As described above, the process gas, for example, the reacted gas, the unreacted gas and the byproduct may be vented out through the first sub-exhaust conduit 280 and the main exhaust conduit 290. In this case, the process gas may react on the atmosphere in the first sub-exhaust conduit 280 and the main exhaust conduit 290 to generate particles. The particles may be deposited on the inner walls of the first sub-exhaust conduit 280 and the main exhaust conduit 290, thereby causing variation of pressure in the exhaust conduits 280 and 290 and corrosion of the exhaust conduits 280 and 290. In particular, a flammable gas such as a silane ($SiH_4$) gas and a hydrogen gas may spontaneously burn to generate particles. Thus, the particles should be removed in order to prevent the pressure in the exhaust conduits 280 and 290 from being changed and prevent the exhaust conduits 280 and 290 from being corroded.

The collection unit may be installed at the sub-exhaust conduit 280 (e.g., the first sub-exhaust conduit 280) or the main exhaust conduit 290 to collect the particles. Hereinafter, it is assumed that the collection unit is installed at the main exhaust conduit 290. However, the collection unit according to the present invention may be installed at the sub-exhaust conduit 280, as described above. Further, in the present embodiment, it is assumed that a single sub-exhaust conduit is connected to one chamber (e.g., the first chamber 100a). However, the number of the sub-exhaust conduit 280 may not be limited to one. For example, a plurality of sub-exhaust conduits may be connected to the first chamber 100a. In this case, the process gases, which flow through the sub-exhaust conduits respectively, may be different gases from each other. For example, when first to third sub-exhaust conduits are connected to the first chamber 100a, the first sub-exhaust conduit may vent a first gas containing an acidic compound, the second sub-exhaust conduit may vent a second gas containing an organic compound, and the third sub-exhaust conduit may vent a third gas containing a flammable material.

When the first chamber 100a is connected to a plurality of sub-exhaust conduits and the collection unit is installed at one of the sub-exhaust conduits, it is preferable that the collection unit is installed at the sub-exhaust conduit which vents the flammable gas. This is because the flammable gas may spontaneously burn to generate a number of particles as described above.

The particles may be mainly deposited on an inner wall of a bent portion of the exhaust conduit. For example, most of the particles may be deposited on an inner wall of a joint where the sub-exhaust conduit and the main exhaust conduit are connected to each other. Moreover, most of the particles may be deposited on a damper which is installed in the exhaust conduit to control a flow rate of the process gas. Thus, it is preferable that the collection unit is installed at a position which is located before the damper or the bent portion of the exhaust conduit on a path of the process gas. In this case, the collection unit may trap most of the particles before the particles reach the damper or the bent portion of the exhaust conduit.

As illustrated in FIG. 3, the collection unit may comprise a trap 420, a collection line 440, a storage chamber 460 and a vent line 480. The trap 420 has an inlet 422 and an outlet. The trap is installed in the main exhaust conduit 290. Further, the trap 420 is disposed so that the inlet 422 of the trap 420 faces toward an opposite direction to a movement direction of the process gas. The trap 420 may have a funnel-shaped configuration. That is, an area of the inlet 422 may be greater than that of the outlet. In this case, a diameter M of the inlet 422 is less than an inside diameter D of the main exhaust conduit 290, and the inlet 422 may be located at a central region of a space surrounded by the main exhaust conduit 290. That is, any portion of the trap 420 may not be in contact with the inner wall of the main exhaust conduit 290. Accordingly, a portion of the process gas flowing through the main exhaust conduit 290 may be introduced into the trap 420, and another portion of the process gas may flow through the space between the trap 420 and the inner wall of the main exhaust conduit 290.

The storage chamber 460 may be disposed under the main exhaust conduit 290, and the collection line 440 may connect the trap 420 to the storage chamber 460. The collection line 440 penetrates a portion of the main exhaust conduit 290, and one end of the collection line 440 is connected to the outlet of the trap 420 and the other end of the collection line 440 is connected to a top plate of the storage chamber 460. The storage chamber 460 may have an empty space therein, and particles in the process gas captured by the trap 420 may be stored in the storage chamber 460. The storage chamber 460 may have a slit 462 which penetrates an upper portion of a side wall thereof. The slit 462 may provide a space in which a blocking plate 520 is inserted. Further, the storage chamber 460 may have an opening 464 which penetrates a lower portion of the side wall thereof. The opening 464 may be closed or opened by a door 468.

One end of the vent line 480 may be connected to the top plate of the storage chamber 460, and the other end of the vent line 480 may be connected to a portion of the main exhaust conduit 290.

The blocking plate 520 may be connected to a driver 540. The blocking plate 520 and the driver 540 constitute a shuttering member 500. The blocking plate 520 may be horizontally moved by the driver 540. When the blocking plate 520 is completely inserted into the storage chamber 460 through the slit 462, the empty space in the storage chamber 460 may be divided into an upper space and a lower space. In this case, when the opening 464 is opened, the lower space may be connected to an outside region of the storage chamber 460 through the opening 464. That is, the opening 464 may act as a path to access to the lower space from the outside region of the storage chamber 460.

A plurality of acoustic wave generators 490 may be disposed on an outer wall of the main exhaust conduit 290. Each of the acoustic wave generators 490 may produce an acoustic wave which travels toward an inside portion of the main exhaust conduit 290. The particles may react to the acoustic wave since each of the particles has its own volume and mass. Thus, the acoustic wave from the generator 490 may move the particles in the main exhaust conduit 290 toward a specific direction. For example, the acoustic waves from the generators 490 may move the particles in the main exhaust conduit 290 toward a central region in the main exhaust conduit 290. The movement direction of the particles may depend on a traveling direction of the acoustic wave.

The acoustic wave generators 490 may be disposed to have the same distance therebetween on a cross sectional view of the main exhaust conduit 290, as illustrated in FIGS. 4 to 6. For example, when the main exhaust conduit 290 is a circular duct as shown in FIG. 4 and the acoustic wave generators 490 comprise four acoustic wave generators, the four acoustic wave generators 490 may be disposed on an upper portion, a lower portion, a left side and a right side of the main exhaust conduit 290 respectively. In this case, the angle between two straight lines connecting the central point of the circular cross section to the adjacent two generators 490 may be 90°. In another embodiment, the main exhaust conduit 290 may be a circular duct as shown in FIG. 5 and the acoustic wave generators 490 may comprise eight acoustic wave generators, for example, first to eighth acoustic wave generators. In this case, the first to fourth generators 490 may be disposed on the upper portion, the lower portion, the left side and the right side of the main exhaust conduit 290 respectively as described with reference to FIG. 4, and the fifth to eighth generators may be disposed between the adjacent two generators respectively. Accordingly, the angle between two straight lines connecting the central point of the circular cross section to the adjacent two generators 490 may be 45°. In still another embodiment, the main exhaust conduit 290 may be a rectangular duct as shown in FIG. 6 and the acoustic wave generators 490 may comprise four acoustic wave generators, for example, first to fourth acoustic wave generators. In this case, the first to fourth generators 490 may be disposed on a top plate, a bottom plate, a left sidewall and a right sidewall of the main exhaust conduit 290.

As illustrated in FIGS. 4 to 6, when all the acoustic wave generators 490 produce acoustic waves traveling toward a central region in the main exhaust conduit 290, the particles in the main exhaust conduit 290 may be gathered at the central region of the space in the main exhaust conduit 290. The greater the quantity of generators 490, the higher a collecting efficiency of the particles is. For example, the collection unit having the eight generators shown in FIG. 5 may exhibit a higher collecting efficiency as compared to the collection unit having the four generators shown in FIG. 4 since the number of the generators 490 shown in FIG. 5 is greater than that of the generators shown in FIG. 4.

According to the embodiments illustrated in FIGS. 4 to 6, the collection unit may have four or eight acoustic wave generators. However, the number of the acoustic wave generators is not limited to 4 or 8. For example, the collection unit according to the present invention may have 2, 3, 5 to 7, 9 or more generators. Further, the generators may be disposed on different positions from the embodiments illustrated in FIGS. 4 to 6. Moreover, the output power of the acoustic wave generators may be appropriately adjusted to control a movement speed of the particles.

Figure 7:
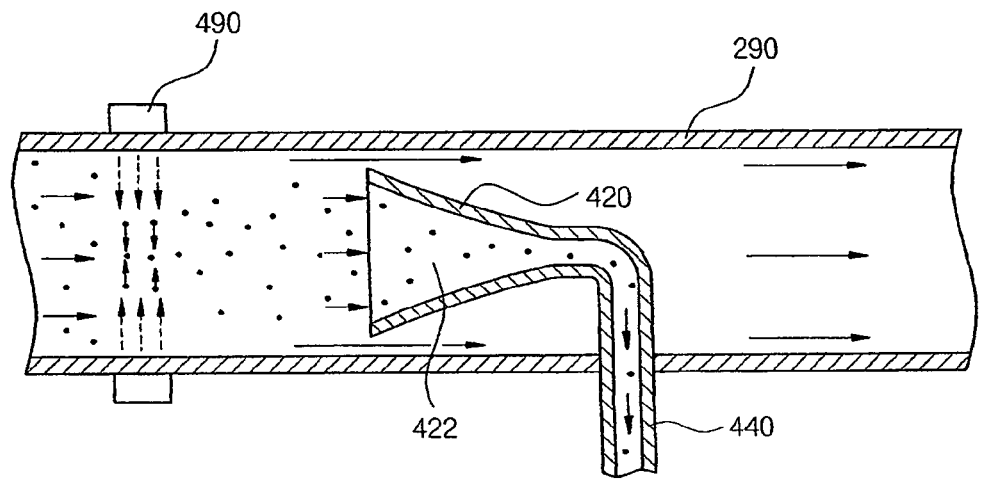
FIGS. 7 to 9 are schematic views illustrating methods for collecting particles using a collection unit shown in FIG. 3.
Figure 8:
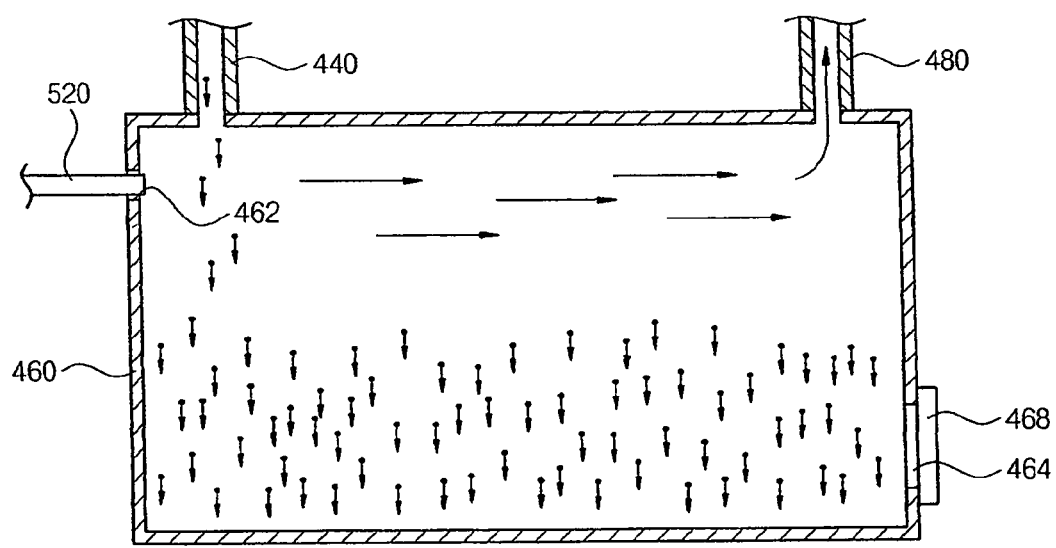
Figure 9:
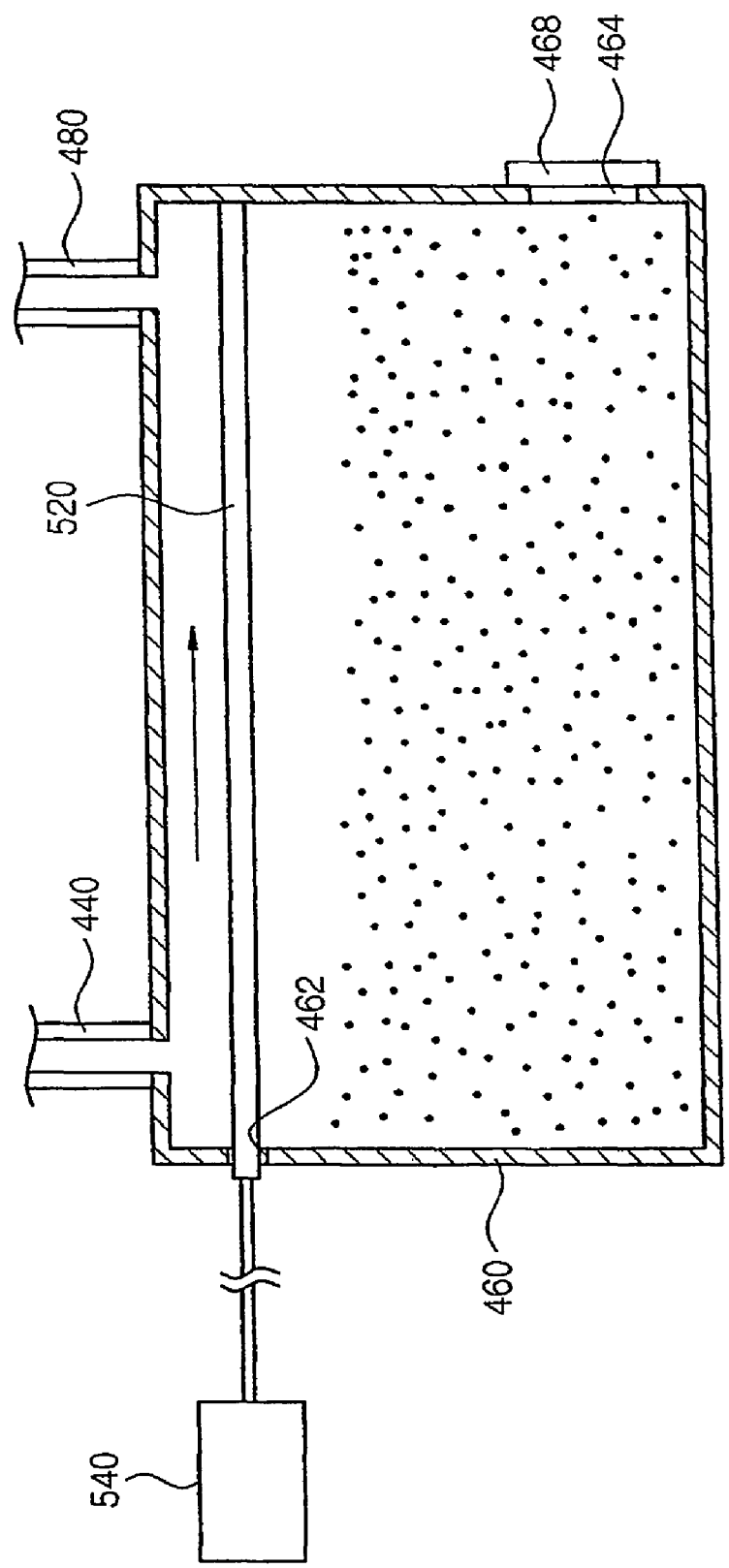

FIGS. 7 to 9 are schematic views illustrating methods for collecting particles using a collection unit shown in FIG. 3, according to an embodiment of the invention.

Referring to FIG. 7, a process gas vented out from a process chamber flows through a main exhaust conduit 290. The process gas may include particles generated in the process chamber and may flow from a left side toward a right side on the drawing of FIG. 7. A trap 420 is installed in the main exhaust conduit 290, and the trap 420 is disposed so that an inlet 422 of the trap 420 faces toward an opposite direction to a movement direction of the process gas, as shown.

A plurality of acoustic wave generators 490 may be disposed on an outer wall of the main exhaust conduit 290. The acoustic wave generators 490 may be located before the trap 420 on a movement path of the process gas. The acoustic wave generators 490 produce acoustic waves which travel toward a central region in the main exhaust conduit 290 as indicated by dotted arrows. The acoustic waves may move the particles in the process gas toward the central region in the main exhaust conduit 290. Thus, the particles in the process gas may be gathered at the central region of the space before the inlet 422 of the trap 420. The particles gathered at the central region in the main exhaust conduit 290 may be introduced into the trap 420 with a portion of the process gas flowing through the inlet 422. Another portion of the process gas without the particles may flow through the space between the trap 420 and the inner wall of the main exhaust conduit 290. Accordingly, the process gas without the particles may still maintain uniform flow even though the trap 420 is installed in the main exhaust conduit 290. The trap 420 has an outlet, and the outlet is connected to a collection line 440 which penetrates a portion of the main exhaust conduit 290. Thus, the process gas having the particles may be vented out through the collection line 440.

Referring to FIG. 8, the collection line 440 is connected to a top plate of a storage chamber 460 which is disposed under the main exhaust conduit 290. The storage chamber 460 may have a slit 462 which penetrates a portion of a sidewall thereof. The slit 462 provides a space in which a blocking plate 520 is inserted. The blocking plate 520 may horizontally move through the slit 462. Thus, when the blocking plate 520 is completely inserted into the storage chamber 460, an empty space in the storage chamber 460 may be divided into an upper space and a lower space. However, the blocking plate 520 is pulled out of the storage chamber 460 as illustrated in FIG. 8 while the acoustic wave generators 490 operate to capture the particles in the process gas. As a result, the particles and a portion of the process gas may be introduced into the storage chamber 460 during operation of the acoustic wave generators 490.

The storage chamber 460 may be connected to a portion of the main exhaust conduit 290 through a vent line 480 as illustrated in FIG. 3. The speed of the particles and the process gas introduced into the storage chamber 460 may become slower. This is because a cross sectional area of a movement path of the particles and the process gas in the storage chamber 460 is greater than that of a movement path of the particles and the process gas in the collection line 440. Accordingly, the particles having their own masses may be precipitated on a bottom plate of the storage chamber 460 by gravity, and only the process gas may flow into the main exhaust conduit 290 through the vent line 480 again.

According to the aforementioned description, the particles in the main exhaust conduit 290 may be collected and stored using the acoustic wave generators 490, the trap 420 and the storage chamber 460. Thus, it can prevent the particles from being deposited onto the inner wall of the main exhaust conduit 290. As a result, the pressure inside the main exhaust conduit 290 may be uniformly maintained and the corrosion of the main exhaust conduit 290 may be prevented. Further, the process gas in the first chamber 100a may be smoothly vented out. In addition, the inlet 422 of the trap 420 has a diameter which is less than an inside diameter of the main exhaust conduit 290. Thus, the variation of the pressure in the main exhaust conduit 290 may be minimized, and the process gas in the main exhaust conduit 290 may be vented out even without use of any additional fans. Moreover, the particles in the process gas may be safely stored in the storage chamber 460. When the amount of the particle stored in the storage chamber 460 increases, there is a need to clean the storage chamber 460.

Referring to FIG. 9, the blocking plate 520 may be slid into the storage chamber 460 through the slit 462 in order to clean the storage chamber 460. The blocking plate 520 may be moved by a driver 540. If the blocking plate 520 is completely slid into the storage chamber 460, the space in the storage chamber 460 is divided into an upper space and a lower space which are separated from each other. Therefore, the stored particles may be located in the lower space.

The storage chamber 460 may have an opening 464 which penetrates a lower portion of the side wall thereof. The opening 464 may be closed or opened by a door 468. The opening 464 is opened and the particles stored in the storage chamber 460 may be removed through the opening 464. The particles in the storage chamber 460 may be removed using a vacuum equipment such as a vacuum cleaner. As a result, the storage chamber 460 is completely cleaned.

Figure 10:
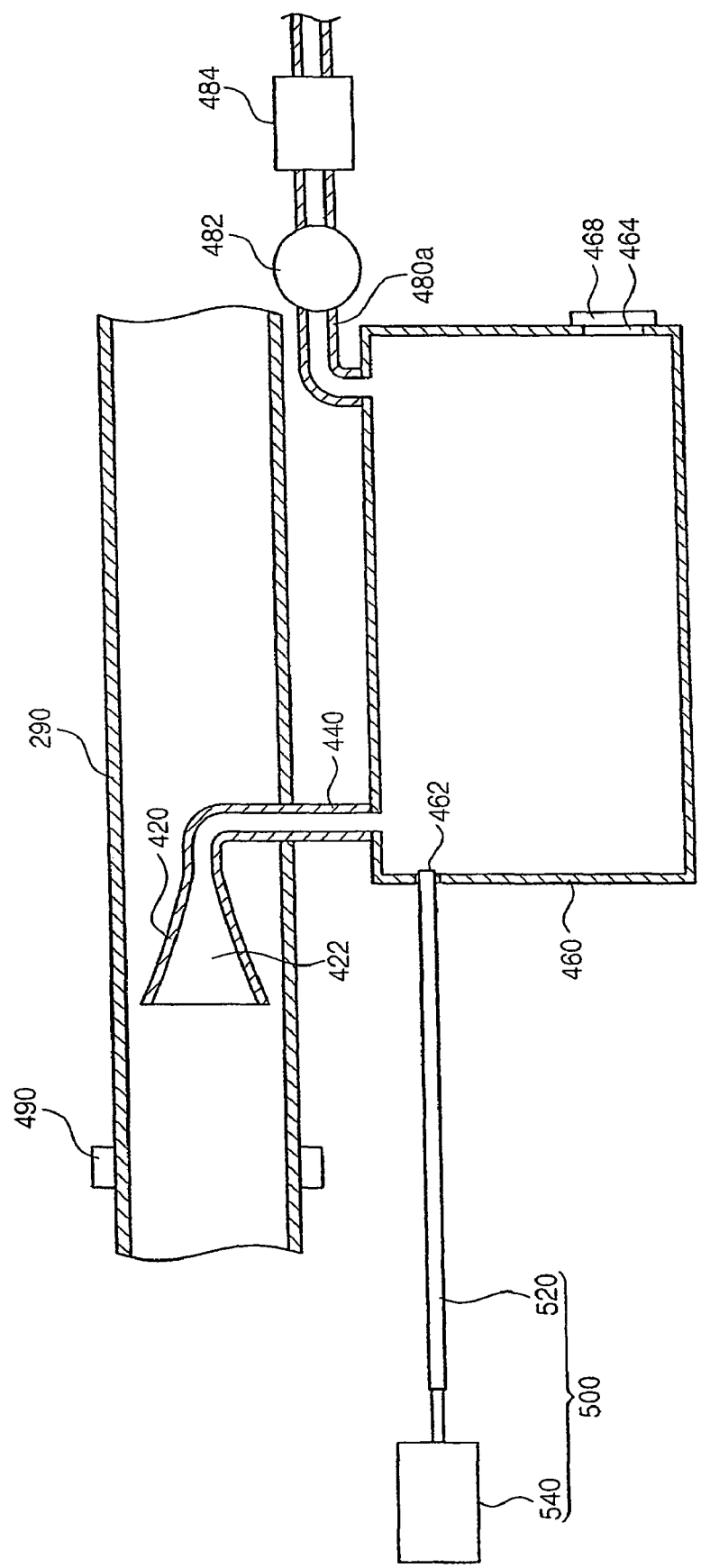
FIG. 10 is a schematic view illustrating a collection unit according to another embodiment of the present invention.

FIG. 10 is a schematic view illustrating a collection unit according to another embodiment of the present invention.

Referring to FIG. 10, the collection unit according to the present embodiment is different from the collection unit shown in FIG. 3 in terms of a configuration of a vent line 480a. According to present embodiment, one end of the vent line 480a is connected to the storage chamber 460 and the other end of the vent line 480a may be directly connected to the final treatment system described above. Thus, the process gas vented out of the storage chamber 460 may be treated in the final treatment system without flow into the main exhaust conduit 290. The final treatment system may purify the process gas and exhaust the purified gas out of the clean room.

A pump 482 and a scrubber 484 may be installed in the vent line 480a. The pump 482 may compulsorily exhaust the process gas in the vent line 480a and the scrubber 484 may neutralize toxic elements in the process gas which flows through the vent line 480a.

Although not shown in the drawings, the pump 482 and the scrubber 484 may be installed in the collection line 440 which is described with reference to FIG. 3.

According to the present invention, particles in a main exhaust conduit may be collected and stored using acoustic wave generators, a trap and a storage chamber. Thus, it can prevent the particles from being deposited onto an inner wall of the main exhaust conduit. As a result, the pressure inside the main exhaust conduit may be uniformly maintained and the corrosion of the main exhaust conduit may be prevented. Further, a process gas in a process chamber may be smoothly vented out. Moreover, the particles in the process gas may be safely stored in the storage chamber.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A substrate treatment apparatus, comprising:
   a process chamber in which a process is performed;
   an exhaust conduit connected to the process chamber to exhaust a process gas in the process chamber; and
   a collection unit installed in and extending from the exhaust conduit to collect particles in the process gas which flows through the exhaust conduit,
   wherein the collection unit comprises:
   a trap installed in the exhaust conduit, the trap having an inlet through which the particles are introduced and an outlet through which the particles are vented out;
   a collection line connected to the outlet of the trap, the collection line penetrating a portion of the exhaust conduit to extend toward an outside region of the exhaust conduit to a storage chamber; and
   a plurality of acoustic wave generators installed onto an outer wall of the exhaust conduit, wherein the acoustic wave generators produce acoustic waves which travel toward an inside region of the exhaust conduit.

2. The apparatus as set forth in claim 1, wherein a diameter of the inlet is less than an inside diameter of the exhaust conduit, and wherein the inlet is disposed at a central region of a space in the exhaust conduit.

3. The apparatus as set forth in claim 1, wherein the acoustic wave generators are disposed to have the same distance therebetween on a cross sectional view of the exhaust conduit.

4. The apparatus as set forth in claim 3, wherein the exhaust conduit has a circular-shaped cross section, and wherein the acoustic wave generators are disposed so that an angle between two straight lines connecting the central point of the circular cross section to the adjacent two acoustic wave generators is 90°.

5. The apparatus as set forth in claim 3, wherein the exhaust conduit has a rectangular-shaped cross section, and wherein the acoustic wave generators are disposed on a top plate, a bottom plate, a left sidewall and a right sidewall of the exhaust conduit respectively.

6. The apparatus as set forth in claim 1, wherein the collection unit further comprises the storage chamber connected to the collection line to store the particles and a vent line connected to a top plate of the storage chamber to exhaust the process gas introduced into the storage chamber, and wherein the storage chamber is disposed under the exhaust conduit.

7. The apparatus as set forth in claim 6, wherein the vent line is connected to the exhaust conduit.

8. The apparatus as set forth in claim 6, wherein the collection unit further comprises:
   a blocking plate moving toward an inside region or an outside region of the storage chamber; and
   a driver connected to the blocking plate to move the blocking plate,
   wherein when the blocking plate is completely moved into the storage chamber, a space in the storage chamber is divided into an upper space and a lower space.

9. The apparatus as set forth in claim 8, wherein the storage chamber has an opening which penetrates a lower portion of a sidewall thereof to access to the lower space, and wherein the opening is closed or opened by a door.

10. The apparatus as set forth in claim 6, wherein the collection unit further comprises:
    a pump installed at the vent line to move the process gas in the vent line; and
    a scrubber installed at the vent line to filter the process gas which flows through the vent line.

11. A substrate treatment apparatus, comprising:
    a process chamber in which a process is performed;
    an exhaust conduit connected to the process chamber to exhaust a process gas in the process chamber; and
    a collection unit installed in and extending from the exhaust conduit to collect particles in the process gas which flows through the exhaust conduit,
    wherein the collection unit comprises:
    a trap installed in the exhaust conduit, the trap having an inlet through which the particles are introduced and an outlet through which the particles are vented out;
    a collection line connected to the outlet of the trap, the collection line penetrating a portion of the exhaust conduit to extend toward an outside region of the exhaust conduit;
    a storage chamber connected to the collection line to store the particles and a vent line connected to a top plate of the storage chamber to exhaust the process gas introduced into the storage chamber, and wherein the storage chamber is disposed under the exhaust conduit,
    a blocking plate moving toward an inside region or an outside region of the storage chamber; and
    a driver connected to the blocking plate to move the blocking plate,
    wherein when the blocking plate is completely moved into the storage chamber, a space in the storage chamber is divided into an upper space and a lower space.

12. The apparatus as set forth in claim 11, wherein the storage chamber has an opening which penetrates a lower portion of a sidewall thereof to access to the lower space, and wherein the opening is closed or opened by a door.

* * * * *